(12) United States Patent
McCann

(10) Patent No.: US 8,519,380 B2
(45) Date of Patent: Aug. 27, 2013

(54) LOW THERMAL CONDUCTIVITY MATERIAL

(75) Inventor: Patrick John McCann, Norman, OK (US)

(73) Assignee: The Board of Regents of the University of Oklahoma, Norman, OK (US)

( * ) Notice: Subject to any disclaimer, the term of this patent is extended or adjusted under 35 U.S.C. 154(b) by 41 days.

(21) Appl. No.: 13/537,164

(22) Filed: Jun. 29, 2012

(65) Prior Publication Data

US 2013/0009132 A1    Jan. 10, 2013

Related U.S. Application Data

(60) Provisional application No. 61/505,723, filed on Jul. 8, 2011.

(51) Int. Cl.
*H01L 29/15* (2006.01)
(52) U.S. Cl.
USPC ............... 257/15; 257/201; 257/E31.008
(58) Field of Classification Search
USPC ................. 257/15, 201, 613, E31.008
See application file for complete search history.

(56) References Cited

U.S. PATENT DOCUMENTS

| | | | |
|---|---|---|---|
| 5,900,071 A | 5/1999 | Harman | |
| 7,342,169 B2 * | 3/2008 | Venkatasubramanian et al. | 136/236.1 |
| 2007/0028956 A1 * | 2/2007 | Venkatasubramanian et al. | 136/201 |
| 2008/0178920 A1 | 7/2008 | Ullo | |
| 2009/0139244 A1 * | 6/2009 | Ullo et al. | 62/3.6 |

FOREIGN PATENT DOCUMENTS

| | | |
|---|---|---|
| WO | 9416465 A1 | 7/1994 |
| WO | 03032408 A1 | 4/2003 |
| WO | 2004012263 A1 | 2/2004 |

OTHER PUBLICATIONS

Shakouri. "Nanoscale Thermal Transport and Microrefrigerators on a Chip." Aug. 2006, Proceedings of the IEEE, vol. 94, No. 8, pp. 1613-1638.*
Harman, T.C. Harman et al., "Quantum Dot Superlattice Thermoelectric Materials and Devices," Science, vol. 297, pp. 2229-2232, Sep. 27, 2002.
Koh, Y. K. et al., "Lattice thermal conductivity of nanostructured thermoelectric materials based on PbTe," Applied Physics Letters, vol. 94, 3 pages, 2009.
Androulakis, J. et al., "Spinodal Decomposition and Nucleation and Growth as a Means to Bulk Nanostructured Thermoelectrics: Enhanced Performance in Pb1-xSnxTe-PbS," Journal of the American Chemiocal Society, vol. 129, pp. 9780-9788, Mar. 2007.
Cahill, D. G., "Thermal conductivity measurement from 30 to 750 K: the 3 Omega method," Review of Science Instruments, vol. 61, No. 2, pp. 802-808, Feb. 1990.
Koh, Y. K. et al., "Comparison of the 3 omega method and time-domain thermoreflectance for measurements of the cross-plane thermal conductivity of epitaxial semiconductors," Journal of Applied Physics, vol. 105, 7 pages, Mar. 2009.

(Continued)

*Primary Examiner* — Wensing Kuo
(74) *Attorney, Agent, or Firm* — Withrow & Terranova, PLLC

(57) ABSTRACT

Embodiments of a material having low cross-plane thermal conductivity are provided. Preferably, the material is a thermoelectric material. In general, the thermoelectric material is designed to block phonons, which reduces or eliminates heat transport due to lattice vibrations and thus cross-plane thermal conductivity. By reducing the thermal conductivity of the thermoelectric material, a figure-of-merit (ZT) of the thermoelectric material is improved. In one embodiment, the thermoelectric material includes multiple superlattice periods that block, or reflect, multiple phonon wavelengths.

21 Claims, 3 Drawing Sheets

(56) References Cited

OTHER PUBLICATIONS

Mccann, P. J. et al., "MBE Growth of PbSe/CaF2/Si(111) Heterostructures," Journal of Crystal Growth, vol. 175/176, pp. 1057-1062, 1997.

Wu, H. Z. et al., "Molecular Beam Epitaxy Growth of PbSe on BaF2-Coated Si(111) and Observation of the PbSe Growth Interface," Journal of Vacuum Science and Technology B, vol. 17, pp. 1263-1266, Jan. 1999.

Fang, X. M. et al., "Molecular Beam Epitaxy of PbSrSe and PbSe/PbSrSe Multiple Quantum Well Structures for use in Mid-Infrared Light Emitting Devices," Journal of Vacuum Science and Technology B, vol. 18, pp. 1720-1723, Feb. 2000.

Wu, H. Z. et al., "Molecular beam epitaxial growth of IV-VI multiple quantum well structures on Si(111) and BaF2(111) and optical studies of epilayer heating," Journal of Vacuum Science and Technology B, vol. 19, pp. 1447-1454, Jul./Aug. 2004.

Li, Y.F. et al., "Improvements of Heat Dissipation by Transfers of IV-VI Epilayers From Silivon to Copper," IEEE Photonics Technology Letters, vol. 16, No. 11, pp. 2433-2435, Nov. 2004.

McCann, P.J. et al., "Above-Room-Temperature Continuous-Wave Mid-Infrared Photoluminescence from PbSe/PbSrSe Quantum Wells," Applied Physics Letters, vol. 75, No. 23, pp. 3608-3610, Dec. 6, 1999.

Findlay, P. C. et al., "Auger Dynamics of Lead Salts under Picosecond Free-Electron Laser Excitation", Physical Review B, vol. 58, No. 19, 8 pages, Nov. 1998.

Elizondo, L. A. et al., "Optically pumped mid-infrared light emitter on silicon", Journal of Applied Physics, vol. 101, 6 pages, May 2007.

Shalyt et al., Lattice and Electrical Thermal Conductivity of PbTe, PbSe, and PbS, Soviet Physics—Solid State, vol. 10, No. 5, pp. 1018-1024, Nov. 1968.

Vineis, C. J. et al., "Carrier concentration and temperature dependence of the electronic transport properties of epitaxial PbTe and PbTe/PbSe nanodot superlattices", Physical Review B, vol. 77, 14 pages, Jun. 2008.

Ren, S. Y. et al., "Thermal conductivity of superlattices", Physical Review B, vol. 25, pp. 3750-3755, Mar. 15, 1982.

Mizuno, S. et al., "Theory of acoustic-phonon transmission in finite-size superlattice systems", Physical Review B, vol. 45, No. 2, pp. 734-741, Jan. 1992.

Ezzahri, Y. et al., "Coherent phonons in Si/SiGe superlattices", Physical Review B, vol. 75, 11 pages, May 2007.

Hepplestone, S. P. et al., "Phononic gaps in thin semiconductor superlattices", Journal of Applied Physics, vol. 107, 9 pages, Feb. 2010.

McCann et al., "MBE-grown IV-VI semiconductor structures for thermal conductivity measurements,"MRS Proceedings, vol. 1404, 6 pages, Mar. 2012.

International Search Report and Written Opinion for PCT/US2012/044765 mailed Nov. 23, 2012, 14 pages.

Jeffers, J. et al., "Cross-plane thermal conductivity of a PbSne/PbSe superlattice matterial," Applied Physics Letters, vol. 99, No. 4, Jul. 27, 2011, 3 pages.

Venkatasubramanian, R. et al., "Phonon-blocking electron-transmitting structures," Eighteenth International Conference on Thermoelectrics, Aug. 29-Sep. 2, 1999, pp. 100-103.

Venkatasubramanian, R., "Lattice thermal conductivity reduction and phonon localizationlike behavior in superlattice structures," vol. 61, No. 4, Jan. 15, 2000, pp. 3091-3097.

Wang, Y. et al., "Acoustic phonon scattering in Bi2Te3/Sb2Te3 superlattices," Applied Physics Letters, vol. 97, vol. 8, Aug. 24, 2010, 3 pages.

\* cited by examiner

| | | PbSnSe (2.4 nm) | 125x SL (594 nm) |
|---|---|---|---|
| | 12-3 | PbSe (2.4 nm) | |
| 10 | 12-2 | PbSnSe (1.8 nm) | 167x SL (595 nm) |
| | | PbSe (1.8 nm) | |
| | 12-1 | PbSnSe (1.2 nm) | 250x SL (594 nm) |
| | | PbSe (1.2 nm) | |

*FIG. 3A*

| | | PbSnSe (4.3 nm) | 30x SL (259 nm) |
|---|---|---|---|
| | 12-5 | PbSe (4.3 nm) | |
| | 12-4 | PbSnSe (3.4 nm) | 38x SL (262 nm) |
| | | PbSe (3.4 nm) | |
| 10 | 12-3 | PbSnSe (2.6 nm) | 50x SL (259 nm) |
| | | PbSe (2.6 nm) | |
| | 12-2 | PbSnSe (1.7 nm) | 75x SL (259 nm) |
| | | PbSe (1.7 nm) | |
| | 12-1 | PbSnSe (0.8 nm) | 150x SL (259 nm) |
| | | PbSe (0.8 nm) | |

*FIG. 3B*

LOW THERMAL CONDUCTIVITY MATERIAL

RELATED APPLICATIONS

This application claims the benefit of provisional patent application Ser. No. 61/505,723, filed Jul. 8, 2011, the disclosure of which is hereby incorporated herein by reference in its entirety.

FIELD OF THE DISCLOSURE

The present disclosure relates to a low thermal conductivity material and, in particular, a low thermal conductivity thermoelectric material.

BACKGROUND

Technologies based upon semiconductor materials and devices have a remarkable track record of commercial achievement. Silicon-based solid state electronics have given us computing technology that has doubled in performance every two years (Moore's Law) for over forty years. Additionally, compound semiconductor optoelectronics, mostly Gallium Arsenide (GaAs) and Indium Phosphide (InP) based III-V semiconductor laser diodes, have given us communications technology that doubles the data coming out of an optical fiber every nine months (Butter's Law of Photonics). Semiconductor technology is now being applied to energy and energy efficiency. Solar cell devices based on Silicon and other semiconductor materials have recently experienced significant commercial success. However, it is widely recognized that there is little room left for significant improvement in solar cell power production efficiencies. In other words, there appears to be no equivalent opportunity for a Moore's Law type of improvement with solar cells. By contrast, thermoelectric materials for power generation from heat sources are increasingly being recognized as having the potential for a Moore's Law type of sustained performance improvement in the clean technology area. Thermoelectric materials can be used to form thermoelectric generators and thermoelectric coolers.

The figure-of-merit (ZT) of a thermoelectric material is a dimensionless unit that is used to compare the efficiencies of various thermoelectric materials. The figure-of-merit (ZT) is determined by three physical parameters: the thermopower $\alpha$ (also known as a Seebeck coefficient), electrical conductivity $\sigma$, and thermal conductivity $k=k_e+k_{ph}$, where the $k_e$ and $k_{ph}$ are thermal conductivities of electrons and phonons, respectively; and absolute temperature T:

$$ZT = \frac{\alpha^2 \sigma}{(k_e + k_{ph})} T.$$

Increasing this value to 2.0 or higher will disrupt existing technologies and will ultimately enable more widespread use of thermoelectric systems. From the equation above, it can be seen that the figure-of-merit (ZT) is inversely proportional to the thermal conductivity of the thermoelectric material. As such, lowering the thermal conductivity of a thermoelectric material will increase the figure-of-merit (ZT). Thus, there is a need for a low thermal conductivity thermoelectric material.

SUMMARY

Embodiments of a material having low cross-plane thermal conductivity are provided. Preferably, the material is a thermoelectric material. In general, the thermoelectric material is designed to block phonons, which reduces or eliminates heat transport due to lattice vibrations and thus cross-plane thermal conductivity. By reducing the thermal conductivity of the thermoelectric material, a figure-of-merit (ZT) of the thermoelectric material is improved. In one embodiment, the thermoelectric material includes multiple superlattice periods that block, or reflect, multiple phonon wavelengths. For each phonon wavelength to be blocked, the superlattice periods include layers of one material composition that each have a thickness approximately equal to a quarter of the phonon wavelength and layers of another material composition that each have a thickness approximately equal to a quarter of the phonon wavelength. Together, the layers of the one material composition that each have a thickness approximately equal to a quarter of the phonon wavelength and the layers of the other material composition that each have a thickness approximately equal to a quarter of the phonon wavelength block, or reflect, the phonon wavelength.

In one embodiment, each superlattice period blocks a different phonon wavelength. More specifically, for each phonon wavelength, a corresponding superlattice period includes an alternating series of a layer of a first material composition each having a thickness that is approximately equal to a quarter of the phonon wavelength and a layer of a second material composition each having a thickness that is approximately equal to a quarter of the phonon wavelength. In one embodiment, the number of superlattice periods, and thus the number of different phonon wavelengths blocked, is greater than 2, greater than 3, greater than 5, greater than 7, or greater than 10. In one embodiment, a size of each superlattice period is greater than or equal to 10, in a range of and including 10 to 200, or in a range of and including 100 to 150. The size of the superlattice period is a number of times that the alternating material compositions in the superlattice period are repeated. In one embodiment, for each superlattice period, the first and second material compositions are Group IV-VI semiconductor material. In another embodiment, for each superlattice period, the first and second material compositions are lower and higher bandgap Group IV-VI semiconductor materials.

In another embodiment, for each of at least two of the phonon wavelengths, layers of a first material composition each having a thickness that is approximately equal to a quarter of the phonon wavelength are included in one of the superlattice periods and layers of a second material composition each having a thickness that is approximately equal to a quarter of the phonon wavelength are included in a different one of the superlattice periods. In one embodiment, the number of superlattice periods, and thus the number of different phonon wavelengths blocked, is greater than 2, greater than 3, greater than 5, greater than 7, or greater than 10. In one embodiment, a size of each superlattice period is greater than or equal to 10, in a range of and including 10 to 200, or in a range of and including 100 to 150. In one embodiment, for each superlattice period, the first and second material compositions are Group IV-VI semiconductor material. In another embodiment, for each superlattice period, the first and second material compositions are lower and higher bandgap Group IV-VI semiconductor materials.

Those skilled in the art will appreciate the scope of the present disclosure and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the disclosure, and together with the description serve to explain the principles of the disclosure.

FIGS. 3A and 3B illustrate two examples of the thermoelectric material of FIG. 1.

DETAILED DESCRIPTION

Figure 1:
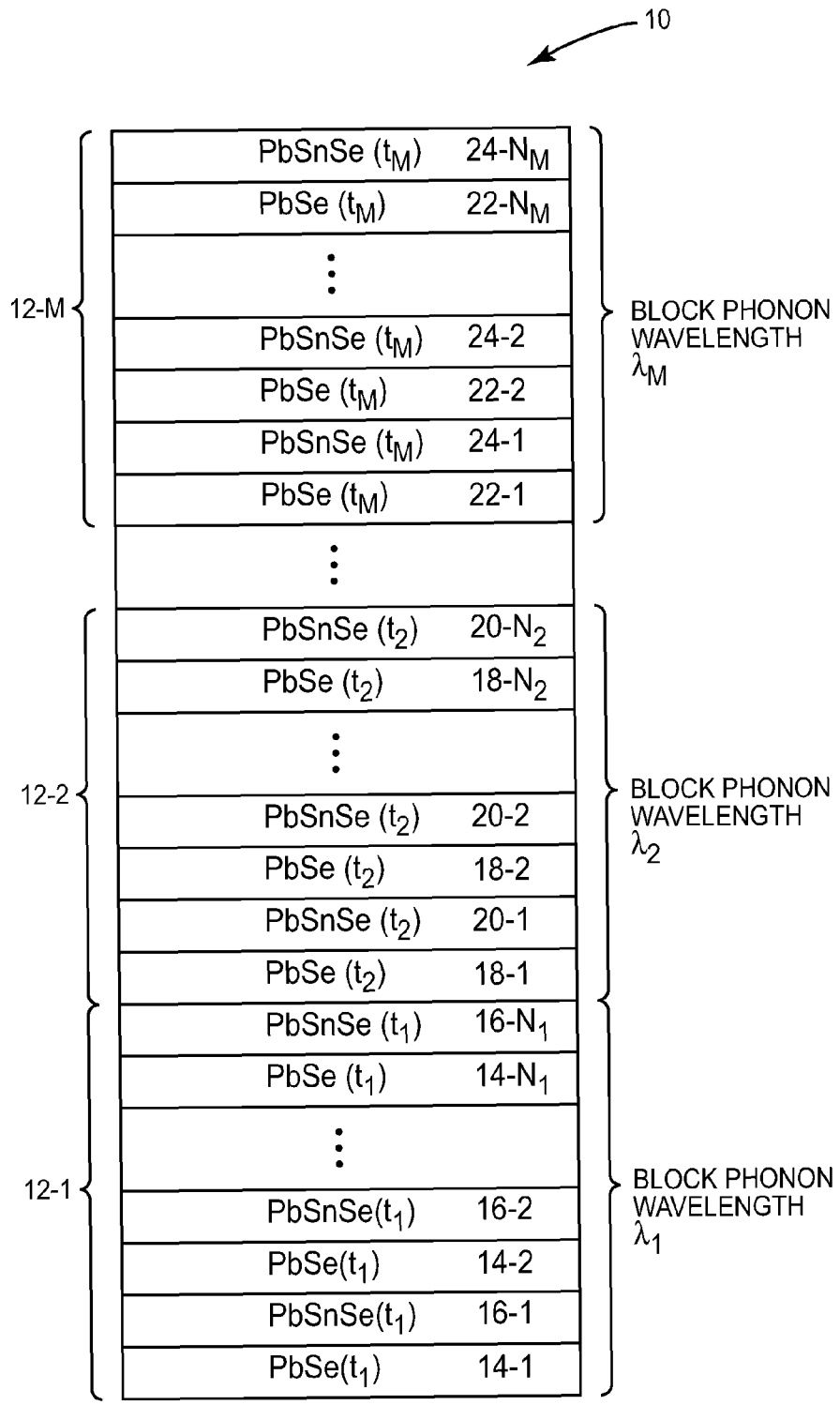
FIG. 1 illustrates a low thermal conductivity thermoelectric material according to one embodiment of the present disclosure.

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

It will be understood that when an element such as a layer, region, or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" may be used herein to describe a relationship of one element, layer, or region to another element, layer, or region as illustrated in the Figures. It will be understood that these terms and those discussed above are intended to encompass different orientations of the device in addition to the orientation depicted in the Figures.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

FIG. 1 illustrates a low thermal conductivity thermoelectric material 10 (hereinafter "thermoelectric material 10") according to one embodiment of the present disclosure. Note that while the embodiments described herein focus on the thermoelectric material 10, the concepts described herein are not limited to thermoelectric materials. In general, the thermoelectric material 10 includes multiple superlattice periods 12-1 through 12-M (sometimes referred to generally as superlattice periods 12 or singularly as superlattice period 12), where M is greater than or equal to 2. More preferably, M is greater than or equal to 3, greater than or equal to 5, greater than or equal to 7, or greater than or equal to 10. The superlattice periods 12-1 through 12-M are designed to block, or reflect, M phonon wavelengths. In this particular embodiment, each of the superlattice periods 12-1 through 12-M is designed to block a different phonon wavelength. By blocking M phonon wavelengths, all or at least a substantial portion of a phonon spectrum (i.e., all phonon wavelengths in the thermoelectric material 10) are blocked, which in turn reduces or minimizes heat transport due to lattice vibrations and therefore a cross-plane thermal conductivity of the thermoelectric material 10. Since the figure-of-merit (ZT) of a thermoelectric material is inversely proportional to the thermal conductivity of the thermoelectric material, the figure-of-merit (ZT) of the thermoelectric material 10 is increased by reducing or minimizing the thermal conductivity of the thermoelectric material 10.

In this particular embodiment, the superlattice period 12-1 blocks, or reflects, a phonon wavelength $\lambda_1$. The phonon wavelength $\lambda_1$ is different than phonon wavelengths $\lambda_2$ through $\lambda_M$ blocked by the other superlattice periods 12-2 through 12-M. As illustrated, the superlattice period 12-1 includes alternating layers of a first material composition and a second material composition. In this particular embodiment, the superlattice period 12-1 includes Lead Selenide (PbSe) layers 14-1 through 14-$N_1$ and Lead-Tin-Selenide (PbSnSe) layers 16-1 through 16-$N_1$ arranged to form an alternating series of PbSe and PbSnSe layers. Note, however, that other materials may be used. In one embodiment, the superlattice period 12-1 is formed of an alternating series of Group IV-VI semiconductor materials. In another embodiment, the superlattice period 12-1 is formed of an alternating series of lower and higher bandgap Group IV-VI semiconductor materials such as, for example, alternating layers of PbSe and Lead-Strontium-Selenide (PbSrSe), alternating layers of Lead Telluride (PbTe) and Lead-Tin-Telluride (PbSnTe), or alternating layers of PbTe and Lead-Strontium-Telluride (PbSrTe). Notably, $N_1$ is referred to herein as a size of the superlattice period 12-1. In other words, the size of the superlattice period 12-1 is a number of times that the PbSe and PbSnSe layers in the superlattice period 12-1 are repeated.

The PbSe layers 14-1 through 14-$N_1$ and the PbSnSe layers 16-1 through 16-$N_1$ each have a thickness ($t_1$) that is equal to, or at least approximately equal to, a quarter of the phonon wavelength $\lambda_1$ that is to be blocked by the superlattice period

12-1. Further, the number ($N_1$) of PbSe layers 14-1 through 14-$N_1$ and PbSnSe layers 16-1 through 16-$N_1$ is preferably greater than or equal to 10, more preferably in the range of and including 10 to 200, and even more preferably in the range of 100 to 150. Preferably, the number ($N_1$) of PbSe layers 14-1 through 14-$N_1$ and PbSnSe layers 16-1 through 16-$N_1$ is such that the superlattice period 12-1 provides greater than or equal to 90% reflection for the phonon wavelength $\lambda_1$, more preferably greater than or equal to 95% reflection for the phonon wavelength $\lambda_1$, and even more preferably greater than or equal to 99% reflection for the phonon wavelength $\lambda_1$. For PbSe/PbSnSe, there is about 99% reflection of the desired phonon wavelength when $N_1$ is approximately equal to 100.

In a similar manner, the superlattice period 12-2 blocks, or reflects, a phonon wavelength $\lambda_2$. The phonon wavelength $\lambda_2$ is different than the phonon wavelengths $\lambda_1$ and $\lambda_3$ (not shown) through $\lambda_M$ blocked by the other superlattice periods 12-1 and 12-3 (not shown) through 12-M. As illustrated, the superlattice period 12-2 includes alternating layers of a first material composition and a second material composition. In this particular embodiment, the superlattice period 12-2 includes PbSe layers 18-1 through 18-$N_2$ and PbSnSe layers 20-1 through 20-$N_2$ arranged to form an alternating series of PbSe and PbSnSe layers. Note, however, that other materials may be used. In one embodiment, the superlattice period 12-2 is formed of an alternating series of Group IV-VI semiconductor materials. In another embodiment, the superlattice period 12-2 is formed of an alternating series of lower and higher bandgap Group IV-VI semiconductor materials such as, for example, alternating layers of PbSe and PbSrSe, alternating layers of PbTe and PbSnTe, or alternating layers of PbTe and PbSrTe. Notably, $N_2$ is referred to herein as a size of the superlattice period 12-2. In other words, the size of the superlattice period 12-2 is a number of times that the PbSe and PbSnSe layers in the superlattice period 12-2 are repeated.

The PbSe layers 18-1 through 18-$N_2$ and the PbSnSe layers 20-1 through 20-$N_2$ each have a thickness ($t_2$) that is equal to, or at least approximately equal to, a quarter of the phonon wavelength $\lambda_2$ that is to be blocked by the superlattice period 12-2. Further, the number ($N_2$) of PbSe layers 18-1 through 18-$N_2$ and PbSnSe layers 20-1 through 20-$N_2$ is preferably greater than or equal to 10, more preferably in the range of and including 10 to 200, and even more preferably in the range of 100 to 150. Preferably, the number ($N_2$) of PbSe layers 18-1 through 18-$N_2$ and PbSnSe layers 20-1 through 20-$N_2$ is such that the superlattice period 12-2 provides greater than or equal to 90% reflection for the phonon wavelength $\lambda_2$, more preferably greater than or equal to 95% reflection for the phonon wavelength $\lambda_2$, and even more preferably greater than or equal to 99% reflection for the phonon wavelength $\lambda_2$. For PbSe/PbSnSe, there is about 99% reflection of the desired phonon wavelength when $N_2$ is approximately equal to 100.

Likewise, the superlattice period 12-M blocks, or reflects, a phonon wavelength $\lambda_M$. The phonon wavelength $\lambda_M$ is different than the phonon wavelengths $\lambda_1$ through $\lambda_{M-1}$ blocked by the other superlattice periods 12-1 through 12-M−1. As illustrated, the superlattice period 12-M includes alternating layers of a first material composition and a second material composition. In this particular embodiment, the superlattice period 12-M includes PbSe layers 22-1 through 22-$N_M$ and PbSnSe layers 24-1 through 24-$N_M$ arranged to form an alternating series of PbSe and PbSnSe layers. Note, however, that other materials may be used. In one embodiment, the superlattice period 12-M is formed of an alternating series of Group IV-VI semiconductor materials. In another embodiment, the superlattice period 12-M is formed of an alternating series of lower and higher bandgap Group IV-VI semiconductor materials such as, for example, alternating layers of PbSe and PbSrSe, alternating layers of PbTe and PbSnTe, or alternating layers of PbTe and PbSrTe. Notably, $N_M$ is referred to herein as a size of the superlattice period 12-M. In other words, the size of the superlattice period 12-M is a number of times that the PbSe and PbSnSe layers in the superlattice period 12-M are repeated.

The PbSe layers 22-1 through 22-$N_M$ and the PbSnSe layers 24-1 through 24-$N_M$ each have a thickness ($t_M$) that is equal to, or at least approximately equal to, a quarter of the phonon wavelength $\lambda_M$ that is to be blocked by the superlattice period 12-M. Further, the number ($N_M$) of PbSe layers 22-1 through 22-$N_M$ and PbSnSe layers 24-1 through 24-$N_M$ is preferably greater than or equal to 10, more preferably in the range of and including 10 to 200, and even more preferably in the range of 100 to 150. Preferably, the number ($N_M$) of PbSe layers 22-1 through 22-$N_M$ and PbSnSe layers 24-1 through 24-$N_M$ is such that the superlattice period 12-M provides greater than or equal to 90% reflection for the phonon wavelength $\lambda_M$, more preferably greater than or equal to 95% reflection for the phonon wavelength $\lambda_M$, and even more preferably greater than or equal to 99% reflection for the phonon wavelength $\lambda_M$. For PbSe/PbSnSe, there is about 99% reflection of the desired phonon wavelength when $N_M$ is approximately equal to 100.

Lastly, while in this particular embodiment, the layers 14-1 through 14-$N_1$, 18-1 through 18-$N_2$, and 22-1 through 22-$N_M$ are formed of the same material composition, the thermoelectric material 10 is not limited thereto. Alternatively, the layers 14-1 through 14-$N_1$ and/or the layers 18-1 through 18-$N_2$ and/or the layers 22-1 through 22-$N_M$ may be formed of different material compositions. For example, the layers 14-1 through 14-$N_1$ may be formed of PbSe, while the layers 18-1 through 18-$N_2$ may be formed of PbTe. Likewise, while in this particular embodiment the layers 16-1 through 16-$N_1$, 20-1 through 20-$N_2$, and 24-1 through 24-$N_M$ are formed of the same material composition, the thermoelectric material 10 is not limited thereto. Alternatively, the layers 16-1 through 16-$N_1$ and/or the layers 20-1 through 20-$N_2$, and/or the layers 24-1 through 24-$N_M$ may be formed of different material compositions. For example, the layers 16-1 through 16-$N_1$ may be formed of PbSnSe, while the layers 18-1 through 18-$N_2$ may be formed of PbSrSe. It should also be noted that, in one embodiment, $N_1 = N_2 = \ldots, = N_M$. However, the present disclosure is not limited thereto. Specifically, $N_1$ through $N_M$ may be any desired values and some, all, or none of them may be equal.

As a result of the thicknesses ($t_1$ through $t_M$) of the layers 14-1 through 14-$N_1$, 16-1 through 16-$N_1$, 18-1 through 18-$N_2$, 20-1 through 20-$N_2$, 22-1 though 22-$N_M$, and 24-1 through 24-$N_M$ and the interfaces between the different material compositions of the layers 14-1 through 14-$N_1$, 16-1 through 16-$N_1$, 18-1 through 18-$N_2$, 20-1 through 20-$N_2$, 22-1 though 22-$N_M$, and 24-1 through 24-$N_M$, the superlattice periods 12-1 through 12-M block the phonon wavelengths ($\lambda_1$ through $\lambda_M$). As discussed above, blocking the phonon wavelengths reduces or minimizes heat transport due to lattice vibrations, which in turn reduces or minimizes the thermal conductivity of the thermoelectric material 10. As a result, the figure-of-merit (ZT) of the thermoelectric material 10 is increased.

Figure 2:
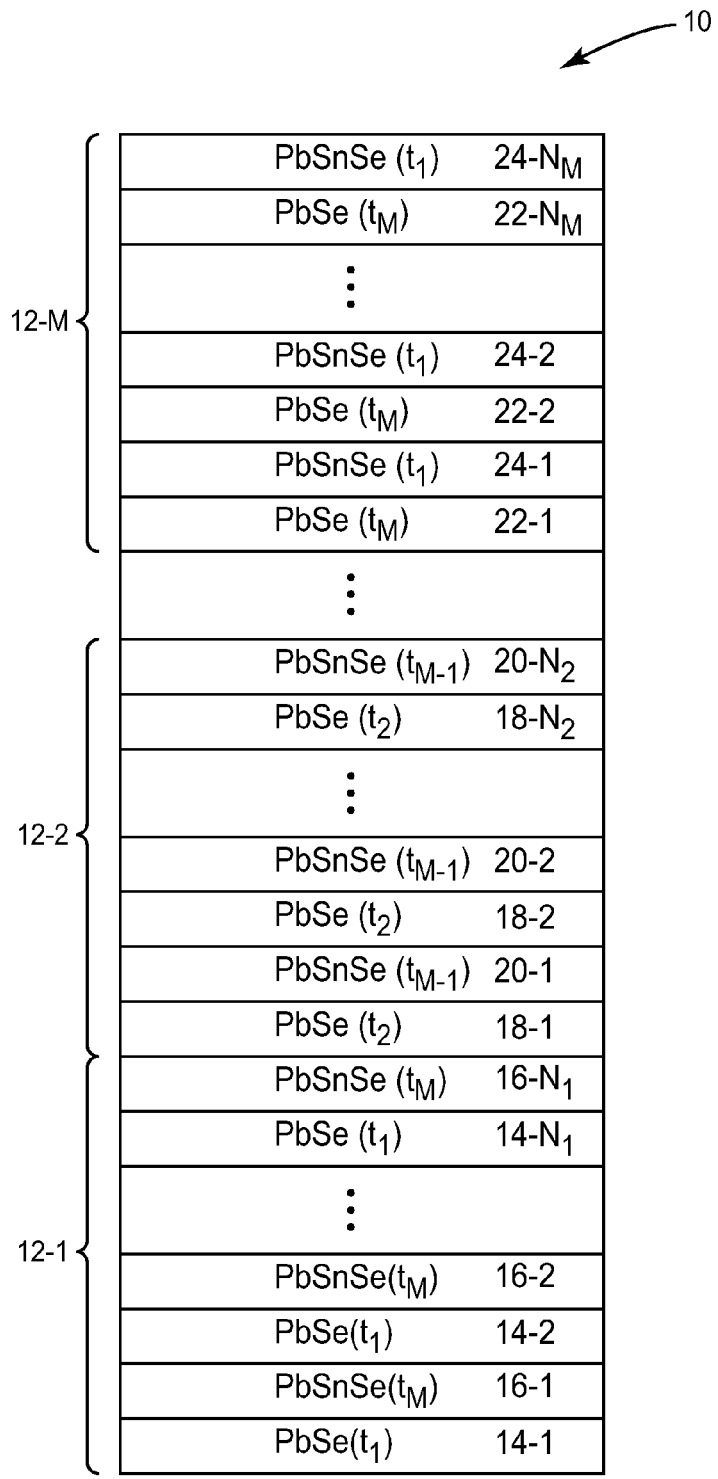
FIG. 2 illustrates a low thermal conductivity thermoelectric material according to another embodiment of the present disclosure.

FIG. 2 illustrates the thermoelectric material 10 according to another embodiment of the present disclosure. In general, the layers of different material compositions for each of the thicknesses ($t_1$ through $t_M$) do not need to be in the same superlattice period. The layers of different material compositions for all or some of the thicknesses ($t_1$ through $t_M$) may be distributed among the superlattice periods 12-1 through 12-M.

In this embodiment, the superlattice period 12-1 includes alternating layers of a first material composition and a second material composition, where a thickness of the layers of the first material composition are equal to, or at least approximately equal to, a quarter of one phonon wavelength and a thickness of the layers of the second material composition are equal to, or at least approximately equal to, a quarter of another phonon wavelength. Again, the superlattice period 12-1 includes the PbSe layers 14-1 through 14-$N_1$ and the PbSnSe layers 16-1 through 16-$N_1$ arranged to form an alternating series of PbSe and PbSnSe layers. In this particular embodiment, the PbSe layers 14-1 through 14-$N_1$ each have the thickness ($t_1$) that is equal to, or at least approximately equal to, a quarter of the phonon wavelength $\lambda_1$, and the PbSnSe layers 16-1 through 16-$N_1$ each have the thickness ($t_M$) that is equal to, or at least approximately equal to, a quarter of the phonon wavelength $\lambda_M$.

Note that while PbSe and PbSnSe are the material compositions in this embodiment, other materials may be used. In one embodiment, the superlattice period 12-1 is formed of an alternating series of Group IV-VI semiconductor materials. In another embodiment, the superlattice period 12-1 is formed of an alternating series of lower and higher bandgap Group IV-VI semiconductor materials such as, for example, alternating layers of PbSe and PbSrSe, alternating layers of PbTe and PbSnTe, or alternating layers of PbTe and PbSrTe.

In a similar manner, the superlattice period 12-2 includes alternating layers of a first material composition and a second material composition, where a thickness of the layers of the first material composition are equal to, or at least approximately equal to, a quarter of one phonon wavelength and a thickness of the layers of the second material composition are equal to, or at least approximately equal to, a quarter of another phonon wavelength. Again, the superlattice period 12-2 includes the PbSe layers 18-1 through 18-$N_2$ and the PbSnSe layers 20-1 through 20-$N_2$ arranged to form an alternating series of PbSe and PbSnSe layers. In this particular embodiment, the PbSe layers 18-1 through 18-$N_2$ each have the thickness ($t_2$) that is equal to, or at least approximately equal to, a quarter of the phonon wavelength $\lambda_2$, and the PbSnSe layers 20-1 through 20-$N_2$ each have the thickness ($t_{M-1}$) that is equal to, or at least approximately equal to, a quarter of the phonon wavelength $\lambda_{M-1}$.

Note that while PbSe and PbSnSe are the material compositions in this embodiment, other materials may be used. In one embodiment, the superlattice period 12-2 is formed of an alternating series of Group IV-VI semiconductor materials. In another embodiment, the superlattice period 12-2 is formed of an alternating series of higher and lower bandgap Group IV-VI semiconductor materials such as, for example, alternating layers of PbSe and PbSrSe, alternating layers of PbTe and PbSnTe, or alternating layers of PbTe and PbSrTe.

Likewise, the superlattice period 12-M includes alternating layers of a first material composition and a second material composition, where a thickness of the layers of the first material composition are equal to, or at least approximately equal to, a quarter of one phonon wavelength and a thickness of the layers of the second material composition are equal to, or at least approximately equal to, a quarter of another phonon wavelength. Again, the superlattice period 12-M includes the PbSe layers 22-1 through 22-$N_M$ and the PbSnSe layers 24-1 through 24-$N_M$ arranged to form an alternating series of PbSe and PbSnSe layers. In this particular embodiment, the PbSe layers 22-1 through 22-$N_M$ each have the thickness ($t_M$) that is equal to, or at least approximately equal to, a quarter of the phonon wavelength $\lambda_M$, and the PbSnSe layers 24-1 through 24-$N_M$ each have the thickness ($t_1$) that is equal to, or at least approximately equal to, a quarter of the phonon wavelength $\lambda_1$.

Note that while PbSe and PbSnSe are the material compositions in this embodiment, other materials may be used. In one embodiment, the superlattice period 12-M is formed of an alternating series of Group IV-VI semiconductor materials. In another embodiment, the superlattice period 12-M is formed of an alternating series of higher and lower bandgap Group IV-VI semiconductor materials such as, for example, alternating layers of PbSe and PbSrSe, alternating layers of PbTe and PbSnTe, or alternating layers of PbTe and PbSrTe.

The thermoelectric material 10 of FIG. 2 includes the PbSe layers 14-1 through 14-$N_1$ having the thickness $t_1$ in the superlattice period 12-1 that together with the PbSnSe layers 24-1 through 24-$N_M$ having the thickness $t_1$ in the superlattice period 12-M block the phonon wavelength $\lambda_1$. The thermoelectric material 10 also includes the PbSe layers 18-1 through 18-$N_2$ having the thickness $t_2$ in the superlattice period 12-2 that together with PbSnSe layers having the thickness $t_2$ in the superlattice period 12-M−1 (not shown) block the phonon wavelength $\lambda_2$. Likewise, the thermoelectric material 10 includes the PbSe layers 22-1 through 22-$N_M$ having the thickness $t_M$ in the superlattice period 12-M that together with the PbSnSe layers 16-1 through 16-$N_1$ having the thickness $t_M$ in the superlattice period 12-1 block the phonon wavelength $\lambda_M$. In a similar manner, other PbSe and PbSnSe layers operate to block any other phonon wavelengths.

More generally, the thermoelectric material 10 of FIG. 2 includes the superlattice periods 12-1 through 12-M, where, for each of the phonon wavelengths $\lambda_1$ through $\lambda_M$ to be blocked, the superlattice periods 12-1 through 12-M include layers of one material composition each having a thickness that is equal to, or at least approximately equal to, a quarter of the phonon wavelength and layers of another material composition each having a thickness that is equal to, or at least approximately equal to, a quarter of the phonon wavelength. Together, the layers of the different material compositions that have a thickness equal to, or approximately equal to, a quarter of a particular phonon wavelength operate to block the phonon wavelength regardless of their position in the thermoelectric material 10. So, in this particular embodiment, for any particular phonon wavelength, the corresponding PbSe layers and PbSnSe layers can be alternating layers in the same superlattice period 12. Alternatively, the PbSe layers can be located in one superlattice period 12, and the PbSnSe layers can be located in another superlattice period 12.

It should be noted that, for each of the thicknesses ($t_1$ through $t_M$), the number of PbSe layers having the thickness is preferably equal to the number of PbSnSe layers having the same thickness. So, in this particular embodiment, the number ($N_1$) of PbSe layers 14-1 through 14-$N_1$ having the thickness $t_1$ is preferably equal to the number ($N_M$) of PbSnSe layers 24-1 through 24-$N_M$ having the thickness $t_1$. Likewise, the number ($N_2$) of PbSe layers 18-1 through 18-$N_2$ having the thickness $t_2$ is preferably equal to the number ($N_{M-1}$) of PbSnSe layers in the superlattice period 12-$M_{M-1}$ having the thickness $t_2$, and the number ($N_M$) of PbSe layers 22-1 through 22-$N_M$ having the thickness $t_M$ is preferably equal to the number ($N_1$) of PbSnSe layers 16-1 through 16-$N_1$ having the thickness $t_M$.

Further, for each of the thicknesses ($t_1$ through $t_M$), the number of PbSe layers having the thickness and the number of PbSnSe layers having the thickness is preferably greater than or equal to 10, more preferably in the range of and including 10 to 200, and even more preferably in the range of 100 to 150. Preferably, for each of the thicknesses ($t_1$ through $t_M$), the number of PbSe layers having the thickness and the number of PbSnSe layers having the thickness is such that together the PbSe and PbSnSe layers provide greater than or equal to 90% reflection for the corresponding phonon wavelength, more preferably greater than or equal to 95% reflection for the corresponding phonon wavelength, and even more preferably greater than or equal to 99% reflection for the corresponding phonon wavelength. For PbSe/PbSnSe, there is about 99% reflection of the desired phonon wavelength when there are approximately 100 PbSe layers and 100 PbSnSe layers of the corresponding thickness.

While in the particular embodiment of FIG. 2 the layers 14-1 through 14-$N_1$, 18-1 through 18-$N_2$, and 22-1 through 22-$N_M$ are formed of the same material composition, the thermoelectric material 10 is not limited thereto. Alternatively, the layers 14-1 through 14-$N_1$ and/or the layers 18-1 through 18-$N_2$ and/or the layers 22-1 through 22-$N_M$ may be formed of different material compositions. For example, the layers 14-1 through 14-$N_1$ may be formed of PbSe, while the layers 18-1 through 18-$N_2$ may be formed of PbTe. Likewise, while in this particular embodiment the layers 16-1 through 16-$N_1$, 20-1 through 20-$N_2$, and 24-1 through 24-$N_M$ are formed of the same material composition, the thermoelectric material 10 is not limited thereto. Alternatively, the layers 16-1 through 16-$N_1$ and/or the layers 20-1 through 20-$N_2$, and/or the layers 24-1 through 24-$N_M$ may be formed of different material compositions. For example, the layers 16-1 through 16-$N_1$ may be formed of PbSnSe, while the layers 18-1 through 18-$N_2$ may be formed of PbSrSe. It should also be noted that, in one embodiment, $N_1=N_2=\ldots,=N_M$. However, the present disclosure is not limited thereto.

Lastly, it should be noted that while in the embodiment of FIG. 2 each of the superlattice periods 12-1 through 12-M includes PbSe layers of one thickness and PbSnSe layers of another thickness, the thermoelectric material 10 is not limited thereto. Some of the superlattice periods 12-1 through 12-M may include PbSe layers and PbSnSe layers of the same thickness whereas others of the superlattice periods 12-1 through 12-M may include PbSe layers and PbSnSe layers of different thicknesses. Further, while one particular arrangement of the layers is illustrated in FIG. 2, the thermoelectric material 10 is not limited thereto. The layers of the thermoelectric material 10 may be arranged in any desired manner as long as the thermoelectric material 10 includes layers of different material compositions for each of the desired thicknesses ($t_1$ through $t_M$).

As a result of the thicknesses ($t_1$ through $t_M$) of the layers 14-1 through 14-$N_1$, 16-1 through 16-$N_1$, 18-1 through 18-$N_2$, 20-1 through 20-$N_2$, 22-1 though 22-$N_M$, and 24-1 through 24-$N_M$ and the interfaces between the different material compositions of the layers 14-1 through 14-$N_1$, 16-1 through 16-$N_1$, 18-1 through 18-$N_2$, 20-1 through 20-$N_2$, 22-1 though 22-$N_M$, and 24-1 through 24-$N_M$, the superlattice periods 12-1 through 12-M block the phonon wavelengths ($\lambda_1$ through $\lambda_M$). As discussed above, blocking the phonon wavelengths reduces or minimizes heat transport due to lattice vibrations, which in turn reduces or minimizes the thermal conductivity of the thermoelectric material 10. As a result, the figure-of-merit (ZT) of the thermoelectric material 10 is increased.

FIGS. 3A and 3B illustrate two examples of the thermoelectric material 10. Note that these embodiments are only examples and are not intended to limit the scope of the present disclosure. More specifically, FIG. 3A illustrates an example of the thermoelectric material 10 similar to that of FIG. 1 that includes three superlattice periods 12-1 through 12-3 (i.e., M=3), wherein $t_1$ is approximately equal to 1.2 nanometers (nm), $t_2$ is approximately equal to 1.8 nm, and $t_3$ is approximately equal to 2.4 nm and $N_1=250$, $N_2=167$, and $N_3=125$. Similarly, FIG. 3B illustrates an example of the thermoelectric material 10 similar to that of FIG. 1 that includes five superlattice periods 12-1 through 12-5 (i.e., M=5), wherein $t_1$ is approximately equal to 0.8 nm, $t_2$ is approximately equal to 1.7 nm, $t_3$ is approximately equal to 2.6 nm, $t_4$ is approximately equal to 3.4 nm, and $t_5$ is approximately equal to 4.3 nm and $N_1=150$, $N_2=75$, $N_3=50$, $N_4=38$, and $N_5=30$. The thermal conductivity of the thermoelectric material 10 of FIG. 3A was experimentally determined to be 1.1 Watts per meter Kelvin (W/mK) ($k_e=0.3$ W/mK and $k_l=0.8$ W/mK), and the thermal conductivity of the thermoelectric material 10 of FIG. 3B was experimentally determined to be 0.6 W/mK ($k_e=0.3$ W/mK and $k_l=0.3$ W/mK). As a comparison, the thermal conductivity of a 1.5 micron thick layer of PbSe was experimentally determined to be 2.2 W/mk ($k_e=0.3$ W/mK and $k_l=1.9$ W/mK). From this experimental data, it can be seen that the thermoelectric material 10 of the present disclosure has reduced thermal conductivity and, as a result, an improved figure-of-merit (ZT).

Those skilled in the art will recognize improvements and modifications to the preferred embodiments of the present disclosure. All such improvements and modifications are considered within the scope of the concepts disclosed herein and the claims that follow.

What is claimed is:

1. A material comprising:
   a plurality of superlattice periods adapted to block a plurality of phonon wavelengths, the plurality of superlattice periods comprising, for each phonon wavelength of the plurality of phonon wavelengths, a plurality of layers of one material composition each having a thickness approximately equal to a quarter of the phonon wavelength and a plurality of layers of another material composition each having a thickness approximately equal to a quarter of the phonon wavelength.

2. The material of claim 1 wherein the plurality of superlattice periods is at least two superlattice periods, and the plurality of phonon wavelengths is at least two phonon wavelengths.

3. The material of claim 1 wherein the plurality of superlattice periods is at least three superlattice periods, and the plurality of phonon wavelengths is at least three phonon wavelengths.

4. The material of claim 1 wherein the plurality of superlattice periods is at least five superlattice periods, and the plurality of phonon wavelengths is at least five phonon wavelengths.

5. The material of claim 1 wherein the plurality of superlattice periods is at least seven superlattice periods, and the plurality of phonon wavelengths is at least seven phonon wavelengths.

6. The material of claim 1 wherein the plurality of superlattice periods is at least ten superlattice periods, and the plurality of phonon wavelengths is at least ten phonon wavelengths.

7. The material of claim 1 wherein, for each phonon wavelength of the plurality of phonon wavelengths, the thickness that is approximately equal to a quarter of the phonon wavelength is a different thickness in a range of and including 0.5 to 10 nanometers.

8. The material of claim 1 wherein each superlattice period of the plurality of superlattice periods comprises an alternating series of a layer of a first material composition and a layer of a second material composition.

9. The material of claim 8 wherein the first material composition is the same in all of the plurality of superlattice periods, and the second material composition is the same in all of the plurality of superlattice periods.

10. The material of claim 8 wherein the first material composition is Lead-Selenide and the second material composition is Lead-Tin-Selenide.

11. The material of claim 8 wherein the first material composition in at least one of the plurality of superlattice periods is different than the first material composition in at least one other of the plurality of superlattice periods, and the second material composition in at least one of the plurality of superlattice periods is different than the second material composition in at least one other of the plurality of superlattice periods.

12. The material of claim 8 wherein, for each superlattice period of the plurality of superlattice periods, the first material composition and the second material composition are different Group IV-VI semiconductor materials.

13. The material of claim 8 wherein, for each superlattice period of the plurality of superlattice periods, the first material composition and the second material composition are higher and lower bandgap Group IV-VI semiconductor materials.

14. The material of claim 8 wherein, for each superlattice period of the plurality of superlattice periods:
the first material composition is one of a group consisting of: Lead-Selenide and Lead-Telluride; and
the second material composition is one of a group consisting of: Lead-Tin-Selenide, Lead-Strontium-Selenide, Lead-Tin-Telluride, and Lead-Strontium-Telluride.

15. The material of claim 1 wherein, for each superlattice period of the plurality of superlattice periods, a size of the superlattice period is at least 10.

16. The material of claim 1 wherein, for each superlattice period of the plurality of superlattice periods, a size of the superlattice period is in a range of and including 10 to 200.

17. The material of claim 1 wherein, for each superlattice period of the plurality of superlattice periods, a size of the superlattice period is in a range of and including 100 to 150.

18. The material of claim 1 wherein, for each phonon wavelength of the plurality of phonon wavelengths, the plurality of layers of the one material composition and the plurality of layers of the other material composition are alternating layers in a corresponding one of the plurality of superlattice periods.

19. The material of claim 1 wherein, for each phonon wavelength of at least two of the plurality of phonon wavelengths, the plurality of layers of the one material composition and the plurality of layers of the other material composition are in different ones of the plurality of superlattice periods.

20. The material of claim 1 wherein the material is a thermoelectric material.

21. A material comprising:
a plurality of superlattice periods comprising, for each thickness of a plurality of different thicknesses in a range of and including 0.5 to 10 nanometers, a plurality of layers of one material composition each having a thickness approximately equal to the thickness and a plurality of layers of another material composition each having a thickness approximately equal to the thickness.

* * * * *